US006985383B2

(12) United States Patent
Tang et al.

(10) Patent No.: US 6,985,383 B2
(45) Date of Patent: Jan. 10, 2006

(54) REFERENCE GENERATOR FOR MULTILEVEL NONLINEAR RESISTIVITY MEMORY STORAGE ELEMENTS

(75) Inventors: Denny D. Tang, Saratoga, CA (US); Wen-Chin Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 49 days.

(21) Appl. No.: 10/689,421

(22) Filed: Oct. 20, 2003

(65) Prior Publication Data

US 2005/0083747 A1     Apr. 21, 2005

(51) Int. Cl.
G11C 11/14   (2006.01)
G11C 11/15   (2006.01)
G11C 7/14    (2006.01)
(52) U.S. Cl. ............... 365/171; 365/158; 365/173; 365/189.09; 365/210
(58) Field of Classification Search ............ 365/171, 365/173, 158, 189.09, 210; 327/53, 66, 132
See application file for complete search history.

(56) References Cited

U.S. PATENT DOCUMENTS 5,768,181 A * 6/1998 Zhu et al. ............. 365/158
5,917,749 A * 6/1999 Chen et al. ........... 365/173
5,953,248 A * 9/1999 Chen et al. ........... 365/158

(Continued)

FOREIGN PATENT DOCUMENTS

JP          62293327 A   * 12/1987

(Continued)

OTHER PUBLICATIONS

"Demonstration of a Four State Sensing Scheme for a Single Pseudo-Spin Valve GMR Bit,"Zhang et al., IEEE Trans. on Magnetics, vol. 35, No. 5, Sep. 1999, pp. 2829-2831.

(Continued)

*Primary Examiner*—Richard Elms
*Assistant Examiner*—J. H. Hur
(74) *Attorney, Agent, or Firm*—Haynes and Boone, LLP

(57) ABSTRACT

A multilevel reference generator has a plurality of nonlinear standard resistive elements where each resistive element is biased at a constant level to develop a resultant level. The multilevel reference generator has a plurality of mirror sources. Each mirror source is in communication with the one of the plurality of resistive elements such that each mirror source receives the resultant level from the one standard resistive element and provides a mirrored replication of the resultant level. The multilevel reference generator has a plurality of reference level combining circuits. The reference level combining circuit includes a resultant level summing circuit that additively combines the first and second mirrored replication level and a level scaling circuit to create a scaling of the combined first and second mirrored replication levels to create the reference level.

32 Claims, 8 Drawing Sheets

U.S. PATENT DOCUMENTS

| | | | |
|---|---|---|---|
| 6,055,178 A | 4/2000 | Naji | 365/158 |
| 6,169,689 B1 | 1/2001 | Naji | 365/173 |
| 6,256,247 B1 * | 7/2001 | Perner | 365/209 |
| 6,317,376 B1 | 11/2001 | Tran et al. | 365/210 |
| 6,324,093 B1 * | 11/2001 | Perner et al. | 365/171 |
| 6,385,109 B1 | 5/2002 | Naji | 365/209 |
| 6,426,907 B1 | 7/2002 | Hoenigschmid | 365/210 |
| 6,445,612 B1 | 9/2002 | Naji | 365/158 |
| 6,456,524 B1 * | 9/2002 | Perner et al. | 365/158 |
| 6,490,192 B2 * | 12/2002 | Thewes et al. | 365/158 |
| 6,496,436 B2 | 12/2002 | Naji | 365/209 |
| 6,501,697 B1 * | 12/2002 | Perner et al. | 365/209 |
| 6,600,690 B1 * | 7/2003 | Nahas et al. | 365/210 |
| 6,621,729 B1 * | 9/2003 | Garni et al. | 365/210 |
| 6,678,187 B2 * | 1/2004 | Sugibayashi et al. | 365/158 |
| 2001/0053104 A1 | 12/2001 | Tran et al. | 365/210 |
| 2002/0080644 A1 * | 6/2002 | Ito | 365/158 |

FOREIGN PATENT DOCUMENTS

| | | |
|---|---|---|
| TW | 518597 | 1/2003 |

OTHER PUBLICATIONS

"Windowed MRAM Sensing Scheme", Zhang et al., "Memory Tech., Records of the 2000 IEEE Int'l Workshop on Design and Testing", Aug. 2000, pp. 47-52.

"A Novel Sensing Scheme for an MRAM with a 5% MR Ratio", Yamada et al., 2001 Symp. on VLSI Circuits Digest of Tech. Papers, Jun. 2001, pp. 123-124.

"Fully Integrated 64 Kb MRAM with Novel Reference Cell Scheme", Jeang et al., Digest Int'l Electron Devices Meeting-IEDM '02, Dec. 2002, pp. 551-554.

* cited by examiner

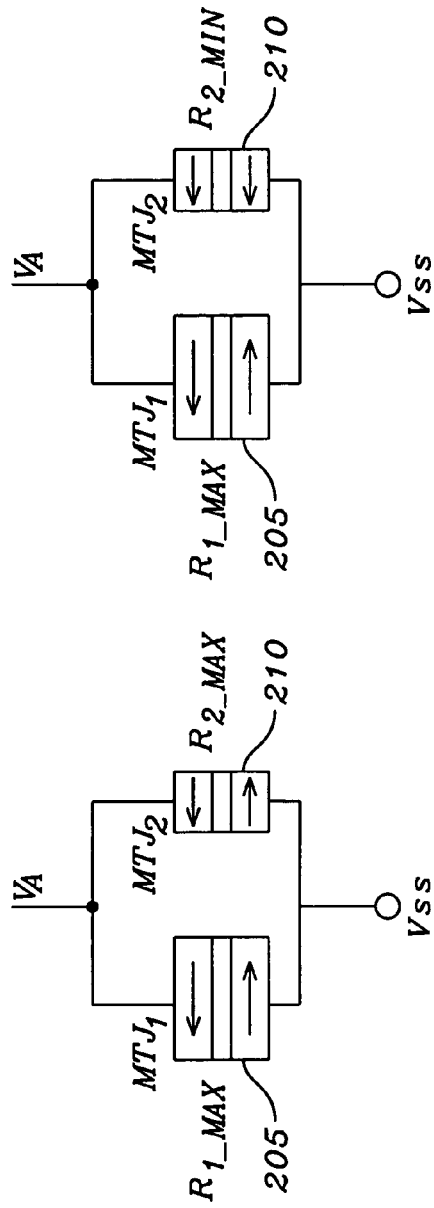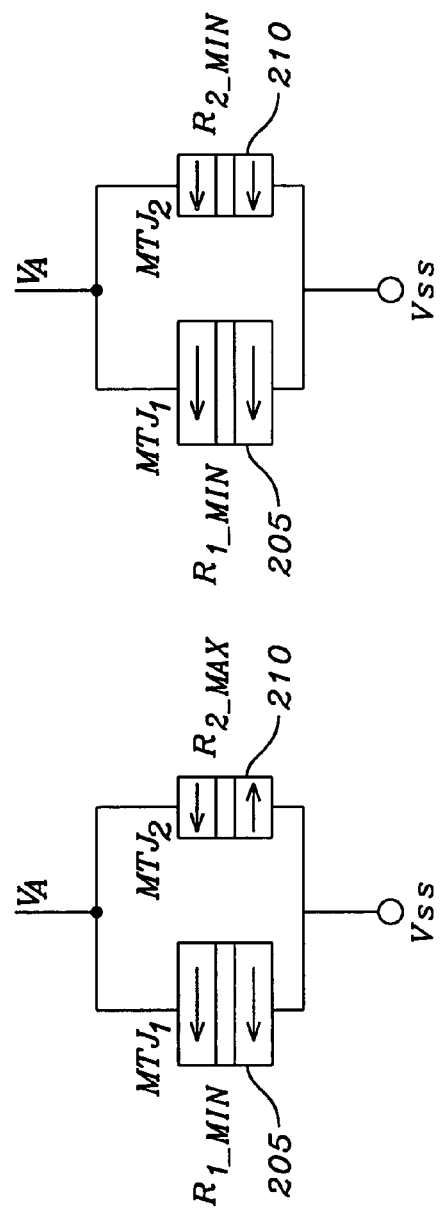
FIG. 10a
FIG. 10b
FIG. 10c
FIG. 10d

REFERENCE GENERATOR FOR MULTILEVEL NONLINEAR RESISTIVITY MEMORY STORAGE ELEMENTS

BACKGROUND OF THE INVENTION

1. Field of the Invention

This invention relates generally to electrical circuits for the generation of reference currents and/or voltages. More particularly, this invention relates to electrical circuits for the generation of multiple reference currents and/or voltages for non-linear resistive elements such as magnetic tunneling junctions (MTJ). Further, this invention relates to electrical circuits for the generation of multiple reference currents and/or voltages to provide the reference levels for the sensing of multiple bits of digital data stored within a Magnetic Random Access Memory (MRAM) cell.

2. Description of Related Art

Magneto-electronic memories are emerging as important memory technologies. Presently, there are three types of magnetic memory devices that are grouped according to the physics of their operation. These categories are a hybrid ferromagnetic semiconductor structure, a metal spin transistor or spin valve, and a magnetic tunnel junction (MTJ). Writing to memories of each of the devices is essentially the same because the direction of a magnetic field determines the state of the digital data stored in a memory cell. However, reading each of the devices is different. The ferromagnetic semiconductor device essentially employs a Hall Effect to determine the state of the digital data stored in the memory cell. The metal spin transistor and the magnetic tunnel junction each employ a change in magneto-resistance to determine a state of the digital data stored in the memory cell. In a metal spin transistor, the relative resistance difference is approximately from 6% to 8%. The discrimination of the state of the digital data is difficult with the metal spin transistor. However, the MTJ has a resistance difference approximately 12%.

As shown in FIG. 1, a memory array 5 is generally formed of groups of MTJ cells 10 in columns and rows. Each MTJ cell 10 has an MTJ device 15 for retaining digital data as an orientation of the magnetic fields within the MTJ device 15. A sense voltage $V_{cell}$ 20 is applied to a selected MTJ cell 15. The application of the sense voltage $V_{cell}$ 20 causes a cell current $I_{cell}$ 25 to flow through the MTJ device 15. The magnitude of the cell current $I_{cell}$ 25 is dependent on the resistance of the MTJ device 15, which is dependent on the orientation of the magnetic fields of the MTJ device 15.

The cell current $I_{cell}$ 25 flows through the cell load resistor 30 to develop the sense voltage $V_{sense}$ 80, which is the input to the comparator 55. The sense voltage $V_{sense}$ 80 is compared within the comparator 55 with the reference voltage $V_{REF}$ 75 to determine the state of the digital data retained within the MTJ device 15. Ideally, the voltage $V_{REF}$ 75 has a magnitude that is approximately the average of the sense voltage $V_{sense}$ 80 with the MTJ device 15 at its maximum resistance ($R_{max}$) and the sense voltage $V_{sense}$ 80 with the MTJ device 15 at its minimum resistance ($R_{min}$). The average of the sense voltage $V_{sense}$ 80 with the MTJ device 15 at its maximum resistance ($R_{max}$) and the sense voltage $V_{sens}$ 80 with the MTJ device 15 at its minimum resistance ($R_{min}$) is dependent upon the expression:

$$V_{sense} \propto \frac{1}{2}(R_{min}+R_{max})$$

A reference current source 35 generates the reference current $I_{REF}$ 45 as function of the a biasing voltage 40 that is approximately twice the magnitude of the sense voltage $V_{cell}$ 20 applied across two pair of serially connected reference resistance devices 36, 37, 38, and 39. The reference resistance devices 36, 37, 38, and 39 are MTJ devices that have their magnetic orientations set such that the reference resistance devices 36 and 38 have their resistance set to the minimum resistance values and the reference resistance devices 37 and 39 set to their maximum resistance values. It can be shown that the reference current $I_{REF}$ 45 becomes the current generated by sense voltage $V_{cell}$ 20 applied to a resistor that has an average value of the maximum resistance and the minimum resistance of the MTJ device 15.

However, it is apparent that the voltage V2 across the reference resistance devices 37 and 39 are greater than the voltage V1 across the reference resistance devices 36 and 38. The resistance of the MTJ devices 36, 37, 38, and 39 is not linear, as is shown in FIG. 2. FIG. 2 shows the biasing voltage dependence of the magneto-resistance (MR) ratio. The MR ratio is defined as the difference in resistance between the two states divided by the resistance in the low state expressed as a percentage. As shown, the voltage dependence indicates that the reference MTJ devices 36 and 38 are biased at the voltage level V1 65 and the reference MTJ devices 37 and 39 are biased at the voltage level V2 70 and that they are not really equal to the sense voltage $V_{cell}$ 20. The reference MTJ devices 36, 37, 38, and 39 do not really have their maximum and minimum resistances equal to the values of the respective maximum and minimum resistance of the MTJ device 15. The equivalent resistance of the reference resistance devices 36, 37, 38, and 39 as configured is not equal to $\frac{1}{2}(R_{min}+R_{max})$. This causes the reference current $I_{REF}$ 45 to be unequal to the average between the cell current $I_{cell}$ 25 with the MTJ device 15 at a maximum resistance ($R_{max}$) and the cell current $I_{cell}$ 25 with the MTJ device 15 at a minimum resistance ($R_{min}$).

"Demonstration of a Four State Sensing Scheme for a Single Pseudo-Spin Valve GMR Bit", Zhang et al., IEEE Transactions on Magnetics, Volume: 35, Issue: 5, September 1999, describes a simple and fast method for sensing four states from a single Pseudo-Spin Valve GMR device.

"Windowed MRAM Sensing Scheme", Zhang, et al., "Memory Technology, Records of the 2000 IEEE International Workshop on Design and Testing," August 2000, pp.: 47–55 details a method for allowing bits with unstable domains to be detected during reading. The method also allows for an improved sensing error rate by identifying read cycles with inadequate signal size caused for example by external noise.

"Novel Sensing Scheme for an MRAM with a 5% MR ratio", Yamada, et al., "Digest of Technical Papers. 2001 Symposium on VLSI Circuits," June, 2001, pp.: 123–124 provides a novel sensing scheme for a magneto-resistive random access memory (MRAM) with a twin cell structure. It operates by sensing the difference in voltage between a couple of magnetic tunnel junctions (MTJ) in a transitional state.

"Fully Integrated 64 Kb MRAM with Novel Reference Cell Scheme", Jeong, et al., "Digest. International Electron Devices Meeting—IEDM '02", December, 2002, pp.: 551–554, employs a new sensing scheme with a separated half-current source. The separated half current source is adopted for the reference bit line to increase the sensing signal.

U.S. Pat. No. 6,317,376 (Tran, et al.) and U.S. patent application 2001/0053104 (Tran, et al.) describe a Magnetic Random Access Memory ("MRAM") device. The MRAM device includes an array of memory cells and generates reference signals that can be used to determine the resistance states of each memory cell in the array, despite variations in resistance due to manufacturing tolerances and other factors such as temperature gradients across the array, electromagnetic interference and aging.

U.S. Pat. No. 6,055,178 (Naji) teaches an MRAM device that includes a memory array and a reference memory array. Each reference memory cell has a magnetic memory cell and a transistor, that is coupled in series and has a reference resistance across the reference memory cell and the transistor. The transistor is controlled by a reference row line control, so as for the reference resistance to show a mid-value between the maximum resistance and the minimum resistance of the magnetic memory cell. A bit line current (Ib) and a reference bit current (Ir) are provided to the magnetic memory cell and the reference memory cell, respectively. Magnetic states alternate the bit line current, which is compared to the reference bit current to provide an output.

U.S. Pat. No. 6,169,689 (Naji) illustrates an MTJ stacked cell memory sensing method and apparatus. The memory array consists of stacks of cells in an addressable array with each stack including MTJ memory cells stacked together with current terminals connected in series, and including a first and second current terminals coupled through an electronic switch to a current source. Each stack includes $2^n$ levels of memory. A voltage drop across an addressed stack is sensed. Reference voltages equal to the $2^n$ memory levels are provided and the sensed voltage drop is compared to the reference voltages to determine the memory level in the addressed stack. Encoding apparatus is used to convert the voltage drop to a digital output signal.

U.S. Pat. No. 6,385,109 (Naji) and U.S. Pat. No. 6,496,436 (Naji) detail readout circuitry for a magnetic tunneling junction (MTJ) memory cell, or an array of MTJ memory cells, which require a varying reference voltage equal to $(V_{bias\_1/2})(1+R_{min}/R_{max})$. The $V_{bias1}$ is a clamping voltage applied to the readout circuitry, $R_{min}$ is a minimum resistance of the magnetic tunneling junction memory cell, and $R_{max}$ is a maximum resistance of the magnetic tunneling junction memory cell. A reference voltage generator generates the reference voltage and includes an operational amplifier and two MTJ memory cells connected to provide an output signal equal to $(V_{bias1}/2)(1+R_{min}/R_{max})$.

U.S. Pat. No. 6,426,907 (Hoenigschmid) describes a reference circuit for an MRAM array, including logic "1" reference MRAM cells and coupled in parallel with logic "0" reference MRAM cells. The reference current is coupled to a measurement resistor of a sense amplifier, which is adapted to determine the logic state of an unknown memory cell.

U.S. Pat. No. 6,445,612 (Naji) specifies an MRAM with midpoint generator reference and method for readout. The MRAM includes a data column of memory cells and a reference column, including a midpoint generator, positioned adjacent the data column on a substrate. The memory cells and the midpoint generator include similar magneto-resistive memory elements, e.g. MTJ elements. The MTJ elements of the generator are each set to one of $R_{max}$ and $R_{min}$ and connected together to provide a total resistance of a midpoint between $R_{max}$ and $R_{min}$. A differential read-out circuit is coupled to the data column and to the reference column for differentially comparing a data voltage to a reference voltage.

SUMMARY OF THE INVENTION

An object of this invention is to provide a reference generator with multiple reference levels.

Another object of this invention is to provide a reference generator that proportionally tracks nonlinear resistive elements.

To achieve at least one of these objects, a multilevel reference generator has a plurality of standard resistive elements such as multilevel magnetic tunnel junctions set to differing parallel and anti-parallel magnetic orientations. Each resistive element is biased at a constant level to impart a resultant level from each resistive element. If the constant level is a constant voltage, the resultant levels of the plurality of resistive elements and the mirrored replications are currents. Alternately, the constant level is a constant current and the resultant levels of the plurality of resistive elements and the mirrored replications are voltages.

The multilevel reference generator has a plurality of mirror sources. Each mirror source is in communication with the one of the plurality of resistive elements such that each mirror source receives the resultant level from the one standard resistive element and provides a mirrored replication of the resultant level.

The multilevel reference generator has a plurality of reference level combining circuits. Each reference level combining circuit is connected to receive a first mirrored replication of one resultant level from one mirror source and a second mirrored replication of the resultant level from a second mirror source. From a combination of the one mirrored replication from the one mirror source and the second mirrored replication from the second mirror source each reference level combining circuit creates one of the reference levels.

The reference level combining circuit includes a summing circuit to additively combine the first and second mirrored replication and a scaling circuit to create a scaling of the combined first and second mirrored replications. This creates a reference level. The reference level maybe a reference current. In the alternative, the reference level is a voltage developed across a reference resistor with the reference current flowing through the reference resistor. Therefore, the reference generator may include a plurality of reference resistors. Each reference resistor associated with one of the plurality of reference level combining circuits to receive the reference current for creation of the voltage that is the reference level.

BRIEF DESCRIPTION OF THE DRAWINGS

FIGS. 10a–10d are schematic diagrams illustrating the magnetic orientation of MTJ devices employed as the reference or standard resistances of this invention.

DETAILED DESCRIPTION OF THE INVENTION

Figure 1:
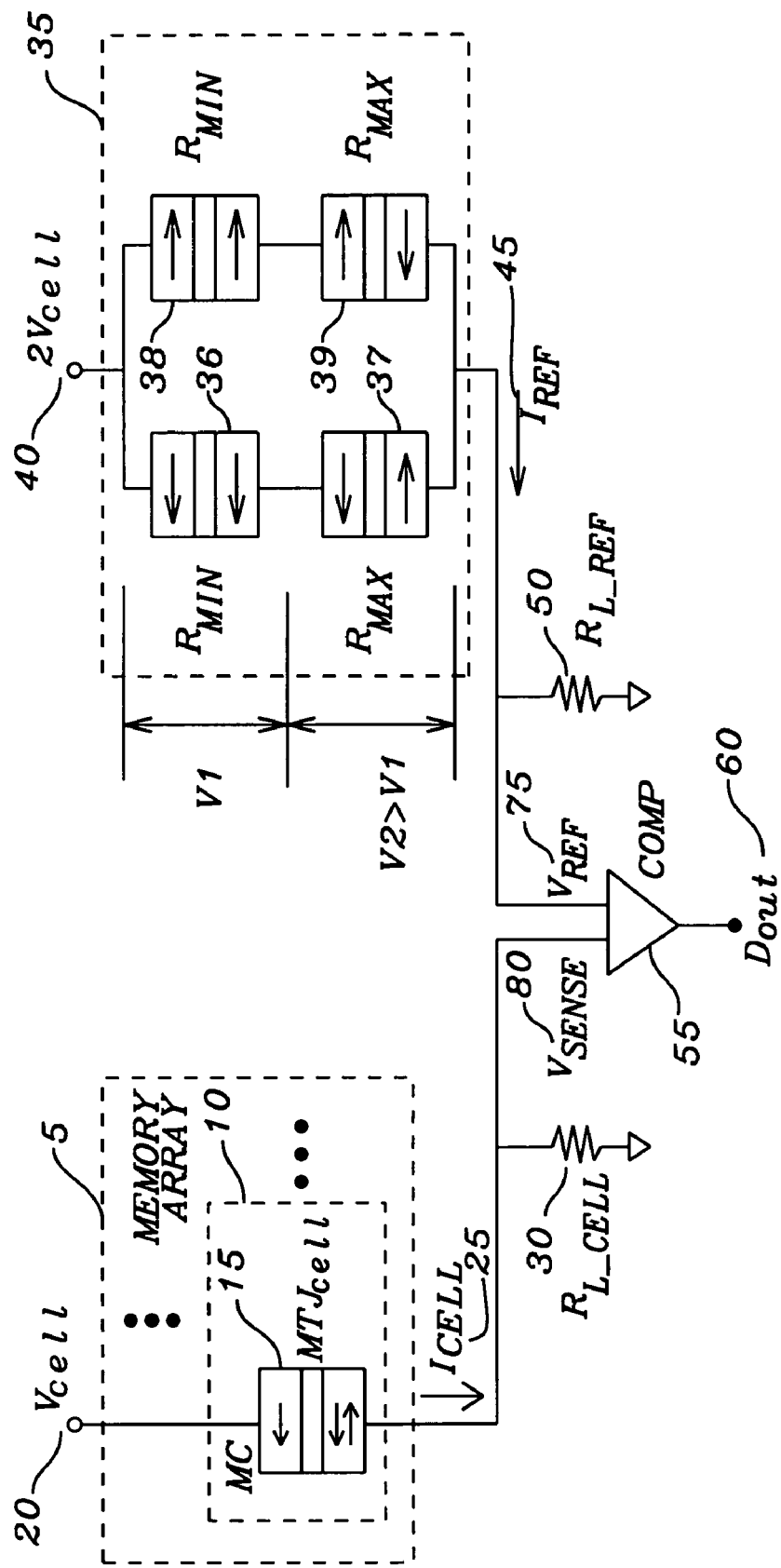
FIG. 1 is a schematic diagram representing an MRAM array with the sense amplifier reference generator of the prior art.
Figure 2:
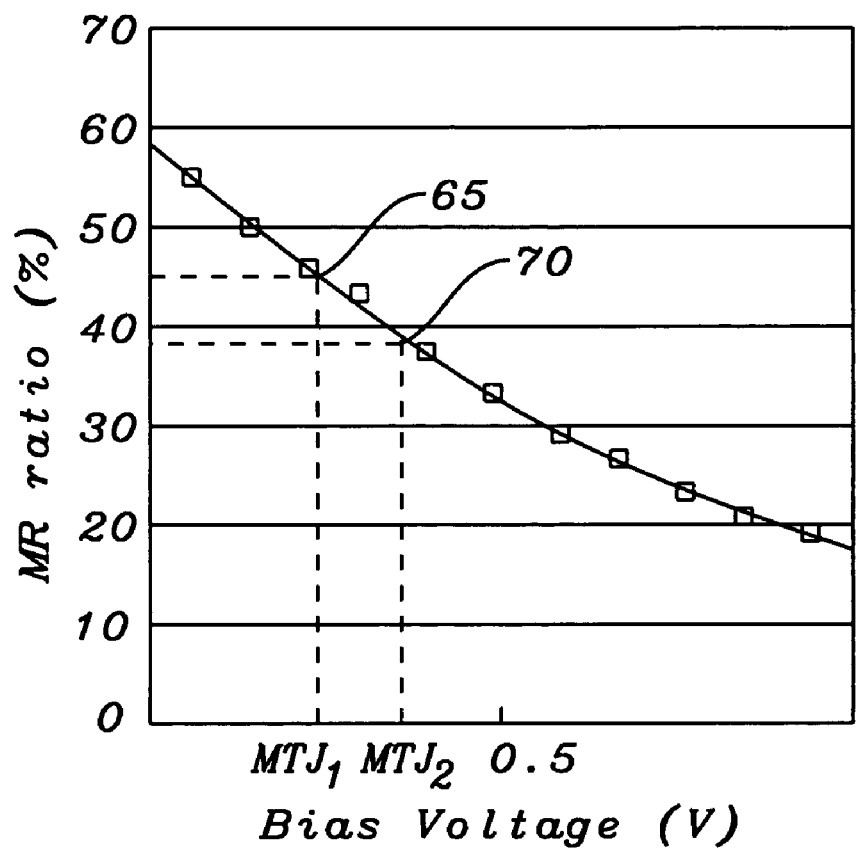
FIG. 2 is a plot of the magneto-resistance factor of an MTJ memory cell versus a biasing voltage of the prior art.
Figure 3:
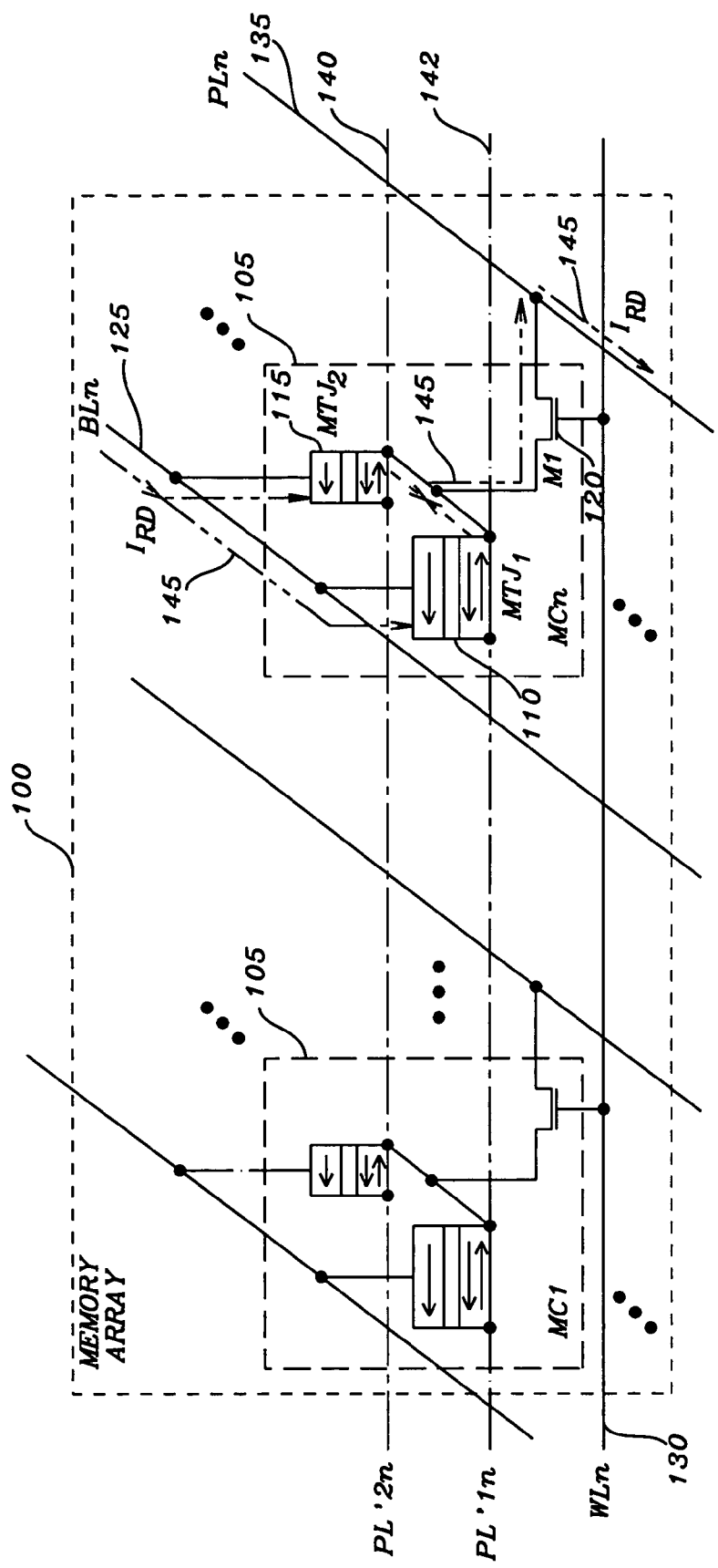
FIG. 3 is a schematic diagram illustrating a multilevel MTJ memory cell.

Referring to FIG. 3, a multilevel MTJ cell 105 in an MRAM memory array 100 consists of two MTJ devices 110 and 115 and a gating transistor 120. The bit line 125 provides a biasing voltage to generate a read current $I_{RD}$ 145 through the two MTJ devices 110 and 115. The word line 130 provides the control signal to activate the gating transistor 120 during either the programming (writing) or reading of the multilevel MTJ cell 105. The primary program line 135 is connected to the source of the gating transistor 120. The second program line 140 is connected to the MTJ device 110. The third program line 142 is connected to the MTJ device 115. The second program line 140 and the third program line 142 provide the programming currents necessary to determine the orientation of the magnetic fields of the two MTJ devices 110 and 115. The primary program line 135 provides the necessary source/return path for these programming currents.

The multilevel memory cell 105, when programmed, contains two bits of digital data or four different states. The MTJ device 110 is sized to have differing maximum and minimum resistivity than that of the MTJ device 115. Thus, if the MTJ device 110 and the MTJ device 115 are both programmed to have parallel orientations, the multilevel MTJ cell 105 has a cell resistance state that is the minimum total resistance. Alternately, if the MTJ device 110 and the MTJ device 115 are both programmed to have anti-parallel orientations, the multilevel MTJ cell 105 has a cell resistance state that is the maximum total resistance. If the MTJ device 110 and the MTJ device 115 are both programmed to have opposite (one parallel and one anti-parallel) orientations, the multilevel MTJ cell 105 has two resistance states that are between the maximum and minimum resistance.

For a read operation, the bit line 125 is set to a constant biasing voltage for generation of the read current $I_{RD}$ 145. The primary program line 135 is connected to provide a path for the flow of the read current $I_{RD}$ 145 for sensing. During the read operation, the word line is activated to turn on the gating transistor 120 to connect the two MTJ devices 110 and 115 to the primary program line 135.

Figure 4:
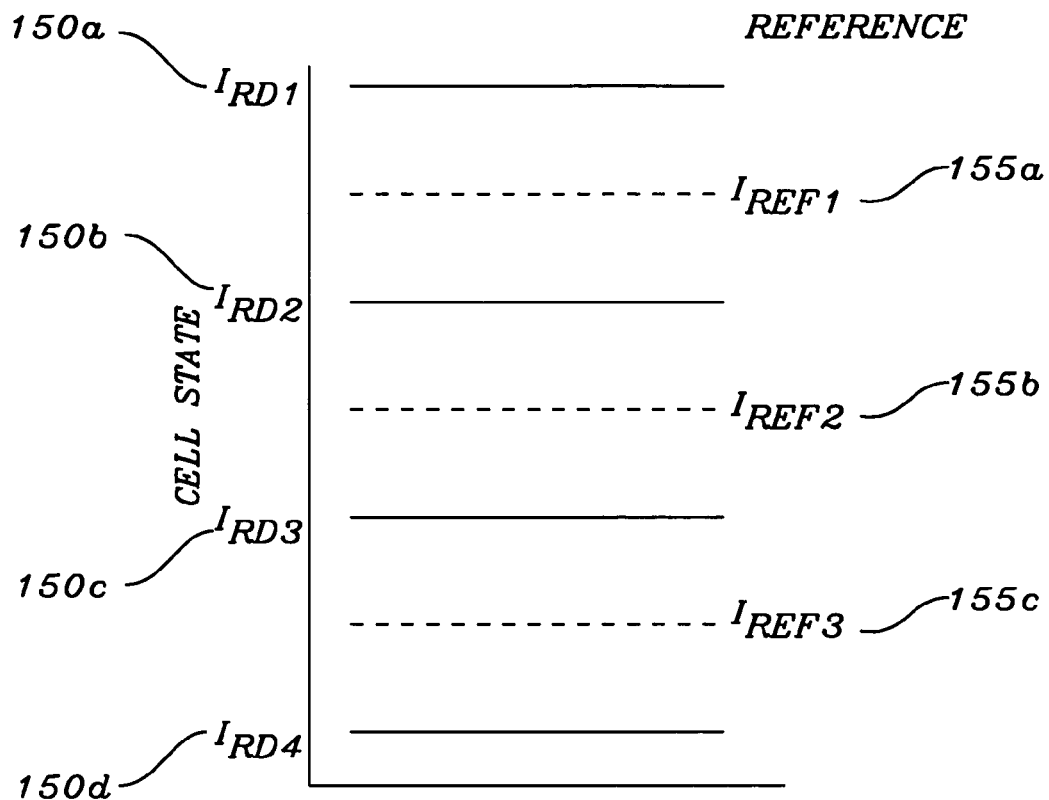
FIG. 4 is a plot illustrating the multiple current levels available from the multilevel MTJ memory cell of FIG. 3.

The read current $I_{RD}$ 145 is transferred to a sense amplifier that must now distinguish between the four different levels of read current $I_{RD}$ 145. A multilevel reference source must provide separate references that are ideally midway between the levels of current of the read current $I_{RD}$ 145 so as to distinguish the four levels of the read current $I_{RD}$ 145. Referring now to FIG. 4, the representation of the four cell resistance states will generate the four read currents $I_{RD1}$ 150a, $I_{RD2}$ 150b, $I_{RD3}$ 150c, and $I_{RD4}$ 150d. The multilevel reference source must provide reference currents $I_{REF1}$ 155a, $I_{REF2}$ 155b, and $I_{REF3}$ 155c that have magnitudes that are midway between the magnitudes of the four read currents $I_{RD1}$ 150a, $I_{RD2}$ 150b, $I_{RD3}$ 150c, and $I_{RD4}$ 150d.

Figure 5:
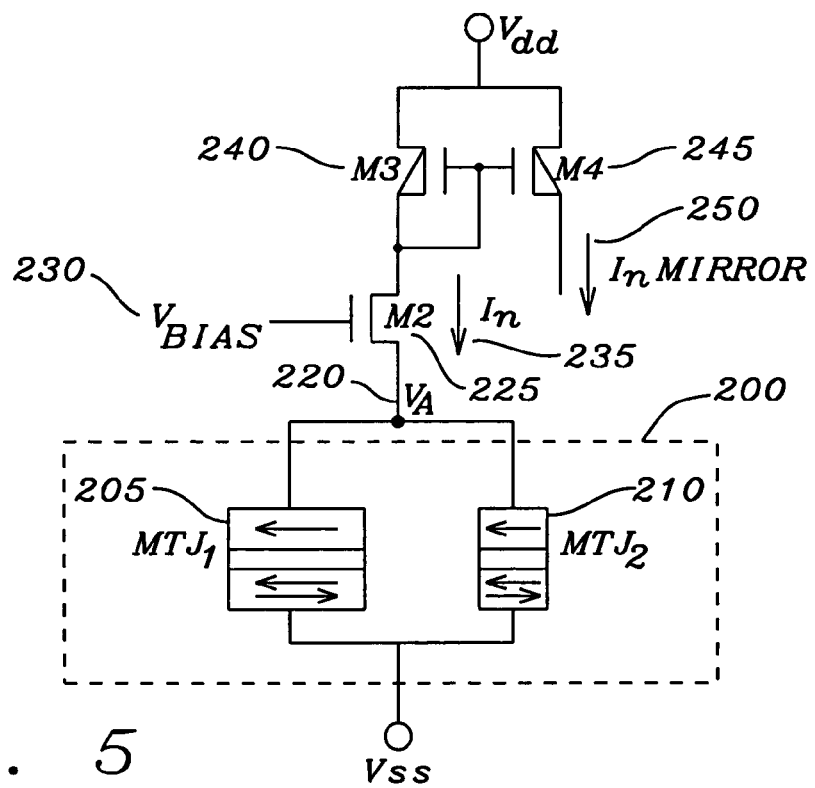
FIG. 5 is a schematic diagram of the reference or standard resistances and the current mirror source of this invention illustrating the constant biasing of the standard resistances.
Figure 6:
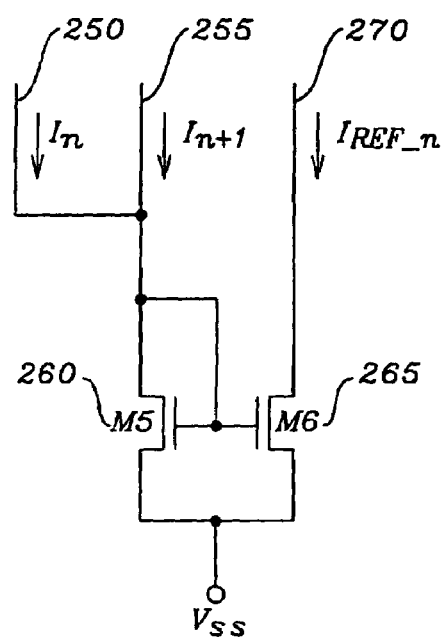
FIG. 6 is a schematic diagram of the current combining circuit to generate the reference current of this invention.

The fundamental circuits that form the multilevel reference generator of this invention are shown in FIGS. 5 and 6.

The multilevel reference generator has a nonlinear resistive element 200 for each of the reference levels provided by the multilevel reference generator. The nonlinear resistive element 200 is biased to a constant voltage level $V_A$ 220 to generate the current $I_n$ 235. The nonlinear resistive element 200 in the preferred embodiment consists of two MTJ devices 205 and 210. The two MTJ devices 205 and 210 are connected in parallel and attached between the constant voltage level $V_A$ 220 and the substrate biasing voltage Vss. The two MTJ devices 205 and 210 are programmed to have their orientation of the magnetic fields as shown in FIGS. 10a–10d. The orientation of the magnetic fields of the two MTJ devices 205 and 210 determine the total resistance of the resistance of the nonlinear resistive element 200. In FIG. 10a, the orientation of the magnetic fields is set to be anti-parallel and the resistance of the nonlinear resistive element 200 is set to the maximum resistance and the current $I_n$ 235 is at its minimum or equivalent to the read current $I_{RD4}$ 150d of FIG. 4. In FIG. 10b, the orientation of the magnetic field of the MTJ device 205 is set to be anti-parallel such that its resistance is at the maximum and the MTJ device 210 is set to be parallel such that its resistance is at the minimum. This makes the resistance of the nonlinear resistive element 200 such that the current $I_n$ 235 is at an intermediate level that is equivalent to the read current $I_{RD3}$ 150c of FIG. 4. In FIG. 10c, the orientation of the magnetic field of the MTJ device 205 is set to be parallel such that its resistance is at the minimum and the MTJ device 210 is set to be anti-parallel such that its resistance is at the maximum. This makes the resistance of the nonlinear resistive element 200 such that the current $I_n$ 235 is at an intermediate level that is equivalent to the read current $I_{RD2}$ 150b of FIG. 4. In FIG. 10d, the orientation of the magnetic fields is set to be parallel and the resistance of the nonlinear resistive element 200 is set to it minimum resistance and the current $I_n$ 235 is at its maximum or equivalent to the read current $I_{RD1}$ 150a of FIG. 4.

Returning to FIG. 5, the source of the biasing transistor 225 is connected to establish the constant voltage level $V_A$ 220. The gate of the biasing transistor 225 is connected to a biasing voltage source $V_{BIAS}$ 230, thus establishing the constant voltage level $V_A$ 220 as the voltage level of the biasing voltage source $V_{BIAS}$ 230 plus the threshold voltage (Vt) of the biasing transistor 225. The current $I_n$ 235 is then determined by the formula:

$$I_n = \frac{(V_A)}{(R_{MTJ1}R_{MTJ2})/(R_{MTJ1}+R_{MTJ2})}$$

The MOS transistors M3 240 and M4 245 are connected as a current mirror source. The gates of the MOS transistors M3 240 and M4 245 are connected together and to the drain of the biasing transistor 225 such that the current $I_n$ 235 flows through the MOS transistor M3 240. The mirror current $I_n$ MIRROR 250 is source from the source of the MOS transistor M4 245.

The multilevel reference generator of this invention will have a resistive element as will the current mirror formed by the MOS transistors M3 240 and M4 245 for each of the four read currents $I_{RD1}$ 150a, $I_{RD2}$ 150b, $I_{RD3}$ 150c, and $I_{RD4}$ 150d of FIG. 4. The structure of the nonlinear resistive element 200 is equivalent to that of the multilevel MTJ cell 105 of FIG. 3. The equivalent structure and the constant voltage level $V_A$ 220 ensure that the mirror currents $I_n$ 235 are approximately equal to the read currents $I_{RD}$ 145.

To generate the reference currents $I_{REF1}$ 155a, $I_{REF2}$ 155b, and $I_{REF3}$ 155c of FIG. 4, the multilevel reference generator combines two of the mirrored current and effectively averages the combined sum to form one of the reference currents. Referring to FIG. 6, the drain of the MOS transistors M5 260 is connected to receive two of the mirrored currents $I_n$ 250 and $I_{n+1}$ 255. The MOS transistors M5 260 and M6 265 are connected as a current source. In the preferred embodiment the MOS transistors M5 260 and M6 265 are scaled in size such that the reference current $I_{REF\_n}$ 270 is determined by the formula:

$$I_{REF\_n} = \frac{(I_n + I_{n+1})}{sf}$$

where:
sf is a scaling factor that in the preferred embodiment is two (2) to achieve the midpoint between the two mirrored currents $I_n$ 250 and $I_{n+1}$ 255.

Figure 7:
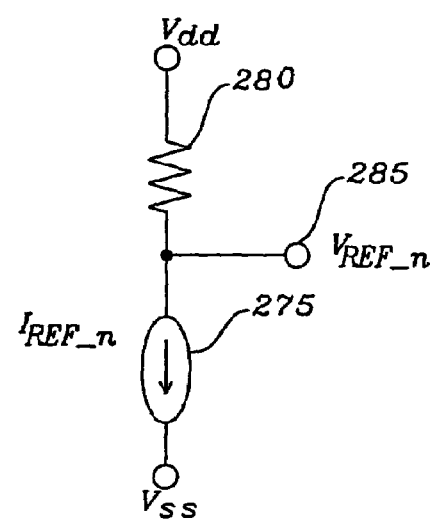
FIG. 7 is a schematic diagram of the reference generator for generating a reference voltage of this invention.

The reference current $I_{REF\_n}$ 270 may be applied directly to the sense amplifier as a reference current. Alternately, as shown in FIG. 7, the reference current $I_{REF\_n}$ 270 of the reference current generator 275 may be applied within the multilevel reference generator of this invention to a reference resistor 280. The voltage across the reference resistor 280 then becomes the reference voltage $V_{REF\_n}$.

Figure 8:
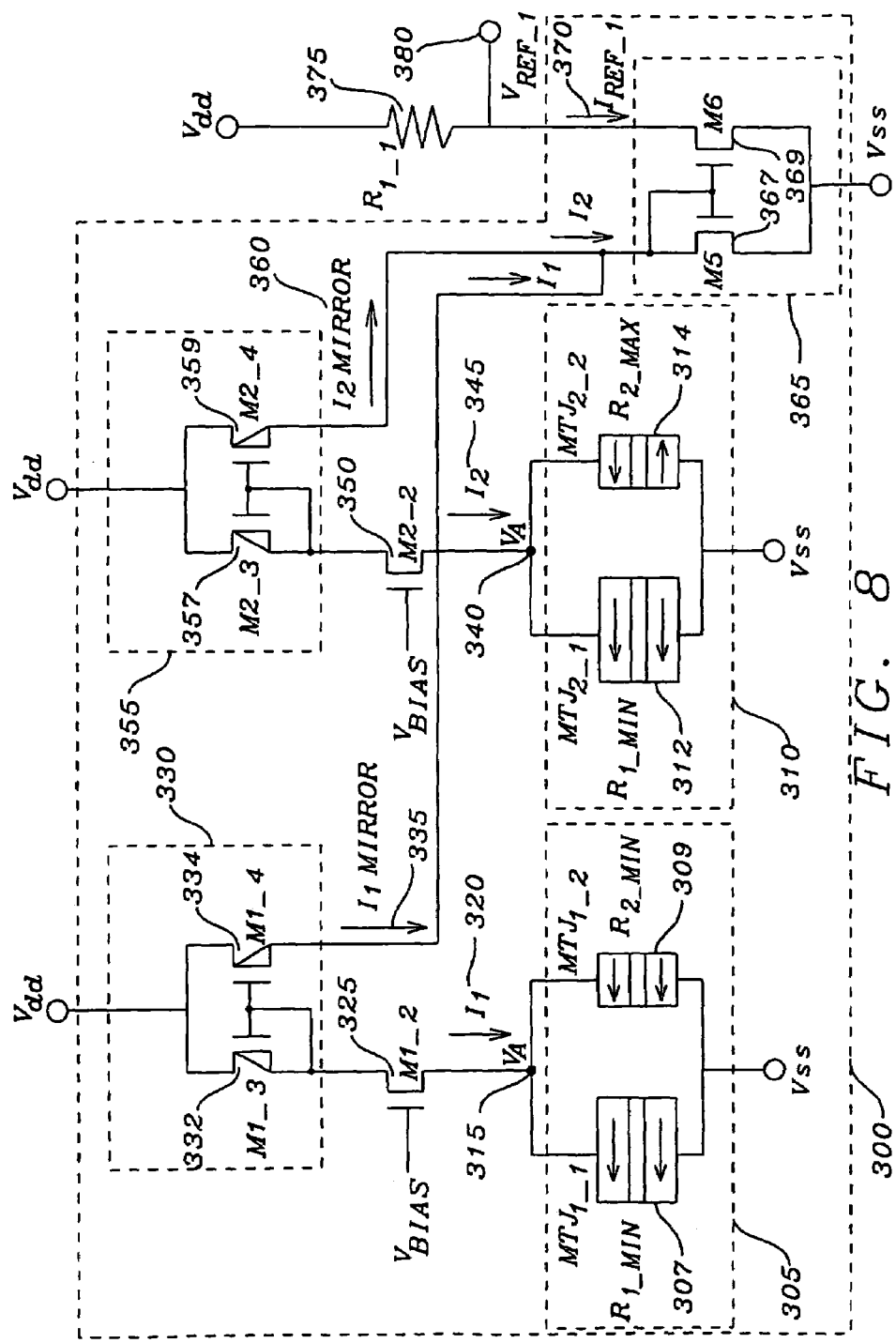
FIG. 8 is a schematic diagram of one of the voltage reference generators of the multilevel voltage reference generator of this invention.

FIG. 8 illustrates the whole reference generation sub-circuit 300 necessary to provide one of the reference levels of a multilevel reference generation circuit of this invention. The reference generation sub-circuit 300 as shown creates the first reference voltage $V_{REF\_1}$ 380 that is developed from the reference current $I_{REF\_1}$ 370. The reference generation sub-circuit 300 includes a first nonlinear resistive element 305. The first nonlinear resistive element is formed by combining two MTJ devices 307 and 309 connected in parallel. The two MTJ devices 307 and 309 have their magnetic fields set to be parallel. This makes the resistance level of the two MTJ devices 307 and 309 at their minimum values and any current through them at the maximum value when they are biased at a constant voltage level $V_A$ 315.

The biasing transistor 325 has its gates set to a biasing voltage $V_{BIAS}$ to set the constant voltage level $V_A$ 315 at the constant level of $V_{BIAS}$ plus the threshold voltage level $V_T$ of the biasing transistor 325. The resultant current $I_1$ 320 flowing through the two MTJ devices 307 and 309 is approximately equivalent to the first read current level $I_{RD1}$ of FIG. 4.

A first mirror source 330 is connected to provide the resultant current $I_1$ 320 and a first mirrored replication current $I_1$MIRROR 335 of the resultant current $I_1$ 320. The first mirror source is formed by connecting the MOS transistors 332 and 334 such that their gates are connected together and to the drain of the biasing transistor 325 and the drain of the MOS transistor 332. The first mirrored replication current $I_1$MIRROR 335 flows from the drain of the MOS transistor 334.

The reference generation sub-circuit 300, further, includes a second nonlinear resistive element 310. The second nonlinear resistive element 310 is formed of two MTJ devices 312 and 314 connected in parallel. The two MTJ devices 312 and 314 have their magnetic fields set to be such that the MTJ device 312 is parallel and the MTJ device 314 is anti-parallel. This makes the resistance level of the MTJ device 312 at its minimum value and the resistance level of the MTJ device 314 at its maximum value and any current through them at an intermediate value when they are biased at a constant voltage level $V_A$ 315.

The biasing transistor 350 has its gates set to a biasing voltage $V_{BIAS}$ to set the constant voltage level $V_A$ 340 at the constant level of $V_{BIAS}$ plus the threshold voltage level $V_T$ of the biasing transistor 350. The resultant current $I_2$ 345 flowing through the two MTJ devices 312 and 314 is approximately equivalent to the second read current level $I_{RD2}$ of FIG. 4.

A second mirror source 355 is connected to provide the resultant current $I_2$ 345 and a second mirrored replication current $I_2$MIRROR 360 of the second resultant current $I_2$ 345. The second mirror source 355 is formed of the MOS transistors 357 and 359 having their gates connected together and to the drain of the biasing transistor 350 and the drain of the MOS transistor 357. The second mirrored replication current $I_2$MIRROR 360 flows from the drain of the MOS transistor 359.

A reference level combining circuit 365 is connected to receive the first mirrored replication current $I_1$MIRROR 335 from the first mirror source 330 and the second mirrored replication current $I_2$MIRROR 360 from the second mirror source 355. A combination current of the first mirrored replication current $I_1$MIRROR 335 and the second mirrored replication current $I_2$MIRROR 360 creates the reference current $I_{REF\_1}$ 370. The reference level combining circuit 365 is formed by the MOS transistors M5 367 and M6 369 which form a current source. The MOS transistors M5 367 and M6 369 are scaled such that the reference current $I_{REF\_1}$ 370 is at the midpoint of the level of the first mirrored replication current $I_1$MIRROR 335 and the level of the second mirrored replication current $I_2$MIRROR 360 as described above. In the preferred embodiment, the scaling of the MOS transistors M5 367 and M6 369 is a factor of two to provide the averaging of the first mirrored replication current $I_1$MIRROR 335 and the second mirrored replication current $I_2$MIRROR 360.

If the reference level of the multilevel generator is to be the reference voltage $V_{REF\_1}$ 380, then the resistor $R_1$ 375 is provided such that the reference current reference current $I_{REF\_1}$ 370 flows through the resistor $R_1$ 375 to develop the reference voltage $V_{REF\_1}$ 380.

Figure 9:
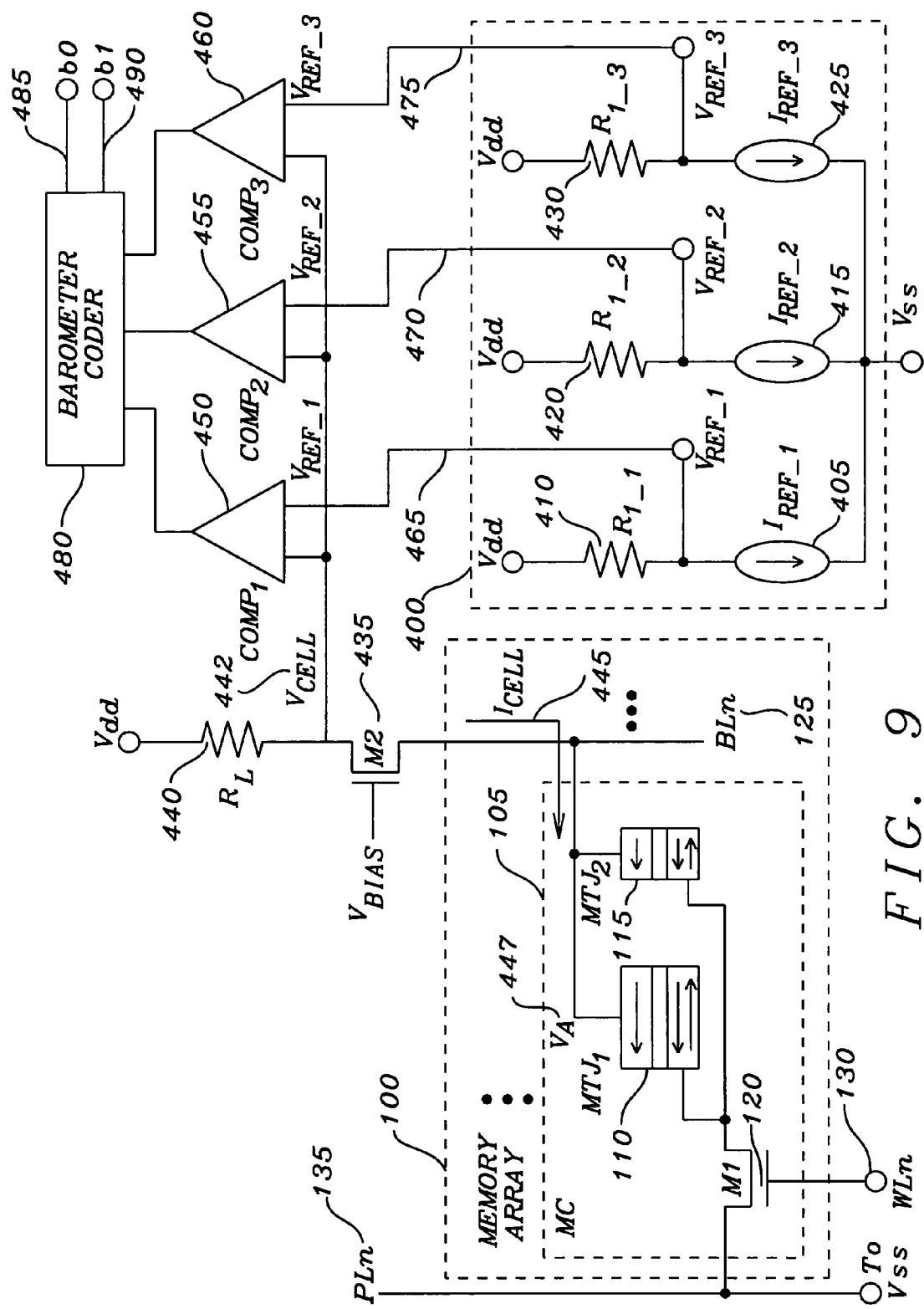
FIG. 9 is a schematic diagram of an MRAM memory array including the multilevel reference voltage generator and sense amplifier of this invention.

Refer now to FIG. 9 for a discussion of the structure and operation of an MRAM utilizing a reference generator of this invention. The MRAM contains a memory array 100 having rows and columns of multilevel MTJ cells 105 as is described in FIG. 3. Bit lines 125 of columns of the multilevel MTJ cells 105 are connected to the biasing transistor such that the voltage $V_A$ 447 is a constant voltage equal to the constant level of $V_{BIAS}$ plus the threshold voltage level $V_T$ of the biasing transistor 435. The voltage $V_{BIAS}$ is the same biasing voltage that establishes the constant voltage $V_A$ 220 of FIG. 5. The word line 130 is set to turn on the transistor 120. The primary program 135 is connected such that it is set to the substrate voltage source $V_{ss}$. The cell current $I_{CELL}$ 445 flows through the MTJ devices 110 and 115 to primary program line 135. The magnitude of the cell current $I_{CELL}$ 445 is determined by the magnetic orientation of the MTJ devices 110 and 115 and is equal to the four read currents $I_{RD1}$ 150a, $I_{RD2}$ 150b, $I_{RD3}$ 150c, and $I_{RD4}$ 150d of FIG. 4. The cell current $I_{CELL}$ 445 flows through the load resistor $R_L$ 440 to develop the cell voltage $V_{CELL}$ 442. The cell voltage $V_{CELL}$ 442 is applied to the comparators 450, 455, and 460. The cell voltage $V_{CELL}$ 442 is compared in the comparators 450, 455, and 460 to the reference voltages $V_{REF\_1}$ 465, $V_{REF\_2}$ 470, and $V_{REF\_3}$ 475 to derive the digital data contents of the memory cell 105. The outputs of the comparators 450, 455, and 460 provide a barometer code that is interpreted by the barometer coder 480 to develop the digital data bits b0 485 and b1 490.

The reference generator 400 is connected to provide the reference voltages $V_{REF\_1}$ 465, $V_{REF\_2}$ 470, and $V_{REF\_3}$ 475 to the comparators 450, 455, and 460. The reference voltages $V_{REF\_1}$ 465, $V_{REF\_2}$ 470, and $V_{REF\_3}$ 475 are produced by the reference generator 400 from the reference current generators $I_{REF\_1}$ 405, $I_{REF\_2}$ 415, and $I_{REF\_3}$ 425. The reference currents $I_{REF\_1}$, $I_{REF\_2}$, and $I_{REF\_3}$ respectively flow through the load resistors $R_{1\_1}$ 410, $R_{1\_2}$ 420, and $R_{1\_3}$ 430 to generate the reference voltages $V_{REF\_1}$ 465, $V_{REF\_2}$ 470, $V_{REF\_3}$ 475. The reference current generators $I_{REF\_1}$ 405, $I_{REF\_2}$ 415, and $I_{REF\_3}$ 425 reference current generators $I_{REF\_1}$ 405, $I_{REF\_2}$ 415, and $I_{REF3}$ 425 are structured and operate as described for the reference generator 300 of FIG. 8.

In summary the process for generating multiple reference levels of this invention begins with providing nonlinear resistive elements such as magnetic tunneling junctions to act as reference elements for the generation of the reference levels. Each resistive element is biased at a constant voltage or current level to impart a resultant current or voltage level from each resistive element. This resultant current or voltage level has a resistance that is a nonlinear function of the applied voltage or current. With the biased voltage as applied to each resistive element being equal to a sensing voltage for determining the stored contents of a memory employing similar resistive elements for the storage elements.

The resultant current or voltage level developed from each nonlinear resistive element is replicated to provide a mirrored replication current or voltage of the resultant current or voltage level from each resistive element. Two of the mirrored replication currents or voltages are effectively combined in a fashion to create each of the multiple reference levels. Normally the combination of the mirrored replication current or voltage levels set the reference level as a midpoint between the two mirrored replication current or voltage levels.

As described for the preferred embodiment, the constant level is a voltage across the resistive element (two MTJ's having particular magnetic orientations). The resultant level is a current from the constant voltage across the resistive element. The resultant current level is then mirrored. Two of the mirror current levels from two resistive elements (two set of two MTJ's, each having differing orientations) are added. The resulting sum current is the then scaled to form the reference current level.

If the desired reference level is a voltage, the reference current flows through a provided reference resistor. The reference current flowing through the reference resistor develops the reference voltage.

While this invention has been particularly shown and described with reference to the preferred embodiments thereof, it will be understood by those skilled in the art that various changes in form and details may be made without departing from the spirit and scope of the invention.

The invention claimed is:

1. A reference generator for providing a reference level, comprising:
a first nonlinear resistive element biased at a constant level to impart a first resultant level from said first resistive element;
a first mirror source in communication with the first nonlinear resistive element to receive the first resultant level and provide a first mirrored replication of said first resultant level;
a second nonlinear resistive element biased at the constant level to impart a second resultant level from said second resistive element;
a second mirror source in communication with the second nonlinear resistive element to receive the second resultant level and provide a second mirrored replication of said second resultant level; and
a reference level combining circuit connected to receive the first mirrored replication of the first resultant level from the first mirror source and the second mirrored replication of the second resultant level from the second mirror source, the reference level combining circuit creating the reference level from a combination of the first mirrored replication and the second mirrored replication.

2. The reference generator of claim 1 wherein the first resistive element has a resistance different from the resistance of the second resistive element.

3. The reference generator of claim 1 wherein the first and second resistive elements are multilevel magnetic tunnel junctions, each comprising multiple electrically connected magnetic tunnel junctions, wherein the magnetic orientations of the first resistive element magnetic tunnel junctions are set in a different pattern than the magnetic orientations of the second element magnetic tunnel junctions.

4. The reference generator of claim 1 wherein the constant level is a constant current and the first and second resultant levels and the first and second mirrored replications are voltages.

5. The reference generator of claim 1 wherein the constant level is a constant voltage and the first and second resultant levels and the first and second replications are currents.

6. The reference generator of claim 5 wherein the reference level combining circuit comprises:
a current summing circuit to additively combine the first and second mirrored replication currents; and
a current scaling circuit to create a scaling of the combined first and second mirrored replication currents to create a reference current.

7. The reference generator of claim 6 wherein the reference level is the reference current.

8. The reference generator of claim 6 further comprising a reference resistor associated with the reference level combining circuit to receive the reference current wherein the reference level is a voltage developed across the reference resistor with said reference current flowing through the reference resistor.

9. A multi level reference generator for providing a plurality of reference levels, comprising:
a plurality of resistive elements, each resistive element biased at a constant level to impart a resultant level from each resistive element;
a plurality of mirror sources, each mirror source in communication with a corresponding one of the plurality of resistive elements such that each mirror source receives the resultant level of the corresponding resistive element and provides a mirrored replication of said resultant level; and
a plurality of reference level combining circuits, each reference level combining circuit connected to receive a first mirrored replication of one resultant level from one of the mirror sources and a second mirrored replication of another resultant level from a second one of the mirror sources, and to combine the two received mirrored replications to create one of a plurality of reference levels.

10. The reference generator of claim 9 wherein each reference level combining circuit receives first and second mirrored replications set in a different pattern than the first and second mirrored replications of each other reference level combining circuit.

11. The reference generator of claim 9 wherein the plurality of resistive elements are multilevel magnetic tunnel junctions set to differing parallel and anti-parallel magnetic orientations.

12. The reference generator of claim 9 wherein the constant level is a constant current and the resultant levels of the plurality of resistive elements and the mirrored replications are voltages.

13. The reference generator of claim 9 wherein the constant level is a constant voltage and the resultant levels of the plurality of resistive elements and the mirrored replications are currents.

14. The reference generator of claim 13 wherein each reference level combining circuit comprises:
a current summing circuit to additively combine the first and second mirrored replication currents; and
a current scaling circuit to create a scaling of the combined first and second mirrored replication currents to create a reference current.

15. The reference generator of claim 14 wherein the plurality of reference currents created by the plurality of reference level combining circuits are the plurality of reference levels.

16. The reference generator of claim 14 further comprising a plurality of reference resistors, each reference resistor associated with one of the plurality of reference level combining circuits to receive the reference current from the associated reference level combining circuit, wherein each reference level is a voltage developed across one of the reference resistors with said reference current from the associated reference level combining circuit flowing through the reference resistor.

17. A method for generating multiple reference levels, comprising the steps of:
providing a plurality of resistive elements;
biasing each resistive element at a constant level to impart a resultant level from each resistive element;
replicating the resultant level from each resistive element to provide a mirrored replication of said resultant level from each resistive element; and
combining a corresponding two of the mirrored replications to create each of the multiple reference levels.

18. The method of claim 17 wherein each reference level is created from two corresponding mirrored replications set in a different pattern than the two corresponding mirrored replications of each other reference level.

19. The method of claim 17 wherein the plurality of resistive elements are multilevel magnetic tunnel junctions, each comprising multiple electrically connected magnetic tunnel junctions, set to selected parallel and anti-parallel magnetic orientations.

20. The method of claim 17 wherein the constant level is a constant current and the resultant levels of the plurality of resistive elements and the mirrored replications are voltages.

21. The method of claim 17 wherein the constant level is a constant voltage and the resultant levels of the plurality of resistive elements and the mirrored replications are currents.

22. The method of claim 21 wherein combining a corresponding two of the mirrored replications comprises the steps of:
summing the corresponding two mirrored replication currents; and
creating a scaling of the summed two mirrored replication currents to create one of multiple reference currents.

23. The method of claim 22 wherein each of the reference levels corresponds to one of the reference currents.

24. The method of claim 22 further comprising the steps of:
providing a plurality of reference resistors,
connecting each reference resistor to receive a corresponding one of the multiple reference currents, wherein each of the reference levels is a voltage developed across a corresponding one of the reference resistors with the corresponding reference current flowing through the reference resistor.

25. A multilevel reference generator for providing a plurality of reference voltage levels for a sense amplifier in an array of multilevel magnetic tunneling junctions, comprising:
a plurality of multilevel magnetic tunneling junctions, each comprising multiple electrically connected magnetic tunnel junctions, each multilevel magnetic tunneling junction biased at a constant voltage level to impart a resultant current level from each multilevel magnetic tunneling junction, the multiple electrically connected magnetic tunnel junctions of each multilevel magnetic tunneling junction set to a selected combination of parallel and anti-parallel magnetic orientations;
a plurality of current mirror sources, each current mirror source in communication with a corresponding one of the plurality of multilevel magnetic tunneling junctions such that each current mirror source receives the resultant current level from the corresponding multilevel magnetic tunneling junction and provides a mirrored replication of the received resultant current level; and
a plurality of reference current level combining circuits, each reference current level combining circuit connected to receive a corresponding first one of the mirrored current replications from one of the current mirror sources and a corresponding second one of the mirrored current replications from a second one of the current mirror sources, each reference current level combining circuit creating one of a plurality of reference voltage levels using a combination of the corresponding first and second mirrored current replications.

26. The reference generator of claim 25 wherein each multilevel magnetic tunneling junction has a resistance different from a resistance of each of the plurality of multilevel magnetic tunneling junctions, wherein each reference level is created from two corresponding mirrored replications set in a different pattern than the two corresponding mirrored replications each of the other reference levels.

27. The reference generator of claim 25 wherein each of the reference level combining circuits comprises:
a current summing circuit to additively combine the first and second mirrored current replications received by that reference level combining circuit; and
a current scaling circuit to create a scaling of the combined first and second mirrored current replications to create a corresponding reference current.

28. The reference generator of claim 27 further comprising a plurality of reference resistors, each reference resistor associated with one of the plurality of reference current level combining circuits to receive the corresponding reference current created by that reference level combining circuit, wherein the voltage reference level created by that reference level combining circuit is a voltage developed across the associated reference resistor.

29. A multilevel magnetic random access memory comprising:
   an array of multilevel magnetic tunneling junctions cells, each multilevel magnetic tunneling junction cell comprising multiple electrically connected magnetic tunnel junctions connected such that the multilevel magnetic tunneling junction cell can be programmed to represent a selected one of more than two different logical states by setting the electrically connected magnetic tunnel junctions in the cell according to a pattern of parallel and anti-parallel magnetic orientations corresponding to the selected logical state;
   a sense amplifier in communication with the array of multilevel magnetic tunneling junctions to determine a data value stored within a selected cell of said array; and
   a multilevel reference generator for providing a plurality of reference voltage levels for the sense amplifier, comprising:
      a plurality of reference multilevel magnetic tunneling junctions, each reference multilevel magnetic tunneling junction comprising multiple electrically connected magnetic tunnel junctions set according to a selected one of the patterns of parallel and anti-parallel magnetic orientations corresponding to one of the selected logical states, each reference multilevel magnetic tunneling junction biased at a constant voltage level to impart a resultant current level from each reference multilevel magnetic tunneling junction;
      a plurality of current mirror sources, each current mirror source in communication with a corresponding one of the plurality of reference multilevel magnetic tunneling junctions such that each current mirror source receives the resultant current level from the corresponding reference multilevel magnetic tunneling junction and provides a corresponding mirrored current replication of the received resultant current level; and
      a plurality of reference current level combining circuits, each reference current level combining circuit connected to receive a first corresponding one of the mirrored current replications from one of the current mirror sources and a second corresponding one of the mirrored current replications from a second one of the current mirror sources, each reference current level combining circuit creating one of the plurality of reference voltage levels using a combination of the corresponding first and second mirrored current replications.

30. The multilevel magnetic random access memory of claim 29 wherein, for each reference current level combining circuit, the first and second corresponding mirrored current replications replicate resultant current levels from two logically adjacent reference multilevel magnetic tunneling junctions, wherein logical adjacency is defined as two of the logical states that result in two of the resultant current levels, where no other logical state results in a resultant current level lying intermediate the two resultant current levels.

31. The multilevel magnetic random access memory of claim 29 wherein each of the reference current level combining circuits comprises:
   a current summing circuit to additively combine the first and second mirrored current replications received by that reference current level combining circuit; and
   a current scaling circuit to create a scaling of the combined first and second mirrored current replications to create a corresponding reference current.

32. The multilevel magnetic random access memory of claim 31 wherein the multilevel reference generator further comprises a plurality of reference resistors, each reference resistor associated with one of the plurality of reference current level combining circuits to receive the corresponding reference current created by that reference level combining circuit, wherein the voltage reference level created by that reference level combining circuit is a voltage developed across the associated reference resistor with said corresponding reference current flowing through the reference resistor.

* * * * *